United States Patent [19]

Weber

[11] 4,263,561
[45] Apr. 21, 1981

[54] AMPLIFIER ARRANGEMENT WITH SUPPRESSION OF SPURIOUS SIGNALS

[75] Inventor: Horst Weber, Freiburg im Breisgau, Fed. Rep. of Germany

[73] Assignee: Hellige GmbH, Freiburg im Breisgau, Fed. Rep. of Germany

[21] Appl. No.: 54,968

[22] Filed: Jul. 5, 1979

[30] Foreign Application Priority Data

Jul. 7, 1978 [DE] Fed. Rep. of Germany ....... 2830033

[51] Int. Cl.³ .............................................. H03D 1/00
[52] U.S. Cl. ..................................... 330/149; 330/69; 330/147
[58] Field of Search .......................... 330/149, 147, 69

[56] References Cited

U.S. PATENT DOCUMENTS

| | | | |
|---|---|---|---|
| 3,725,804 | 4/1973 | Langan | 330/169 |
| 3,906,384 | 9/1975 | Schiffman | 330/149 |
| 4,152,659 | 5/1979 | Gordon | 330/149 |

*Primary Examiner*—Harold A. Dixon

[57] ABSTRACT

For the common mode rejection in an amplifier arrangement comprising preferably a plurality of operational amplifiers for a plurality of desired signals to be processed, which signals are superimposed by a stronger spurious signal, it is an object to supply the desired signals such as physiological measuring signals for EEG and EKG measurements at positive inputs of the respectively associated single amplifiers, while each negative input is connected to the junction of a voltage divider consisting of two resistors, which voltage divider is arranged between the respective amplifier output and a reference potential. This reference potential is determined by the output of an additional operational amplifier, to the positive input of which a desired signal superimposed by the same spurious signal is applied, while the negative input thereof is connected to the junction of a voltage divider consisting of two resistors, which voltage divider is connected between the output of the additional operational amplifier and the reference potential. Accordingly, in signal amplifiers for measuring purposes such as for physiological measuring signals the common mode rejection is already achieved in the preamplifier stages to that separate differential stages for the common mode rejection may be saved.

6 Claims, 1 Drawing Figure

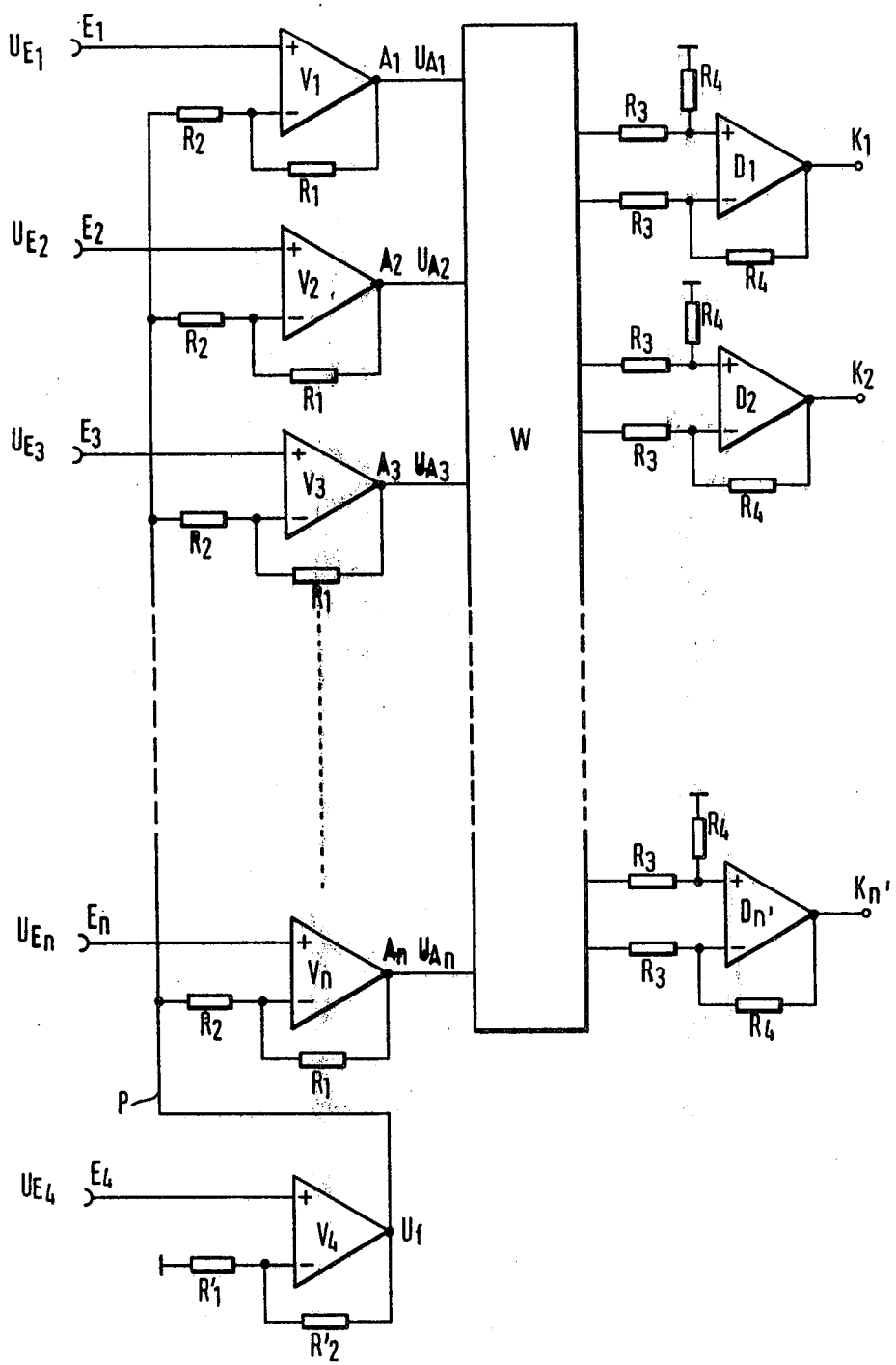

AMPLIFIER ARRANGEMENT WITH SUPPRESSION OF SPURIOUS SIGNALS

BACKGROUND OF THE INVENTION

1. Field of the Invention

This invention relates to an amplification arrangement for processing a plurality of individually generated desired signals.

2. Description of the Prior Art

The problem which is frequently encountered in amplification technology, namely that of amplifying and further processing a low level desired signal which is superimposed by a substantially stronger spurious signal—particularly frequently a supply line disturbance—is conventionally solved by the use of a differential amplifier with common mode rejection. This solution can relatively easily be implemented without running into problems when two desired signals having superimposed thereon spurious signals of the same magnitude are applied to the differential amplifier without distortion, which means when a spurious signal of the same magnitude is applied to the input of the differential amplifier.

However, serious problems arise when the individual signals must be amplified prior to the difference check (difference formation) and when the output impedance should be lowered. Such problem exists, for example in connection with physiological measurements, such as in connection with EEG measurements, in connection with which the very weak desired signal can be superimposed by a spurious signal which is stronger by several orders of magnitude. Then, extremely high requirements prevail as far as the preamplifier for each input signal is concerned. A very small difference between amplification factors of the input amplifiers has the consequence that spurious signals of different strengths appear at the output terminals of these amplifier stages. The differential spurious signal resulting from these differences is then no longer suppressed by the common mode rejection of the succeeding differential amplifier, but rather, it is amplified as if it were a desired signal.

In order to solve this problem, it is known to use as a reference potential for the amplifier arrangement not the zero potential of the circuit (for example mass) but the level of the noise signal. As a result of this principle, the spurious voltage which is applied to the inputs as a push-push voltage is not amplified, but rather appears at the output with identical magnitude. The non-amplified spurious voltage appearing at the output terminals must then be suppressed by a succeeding differential stage. An example of such circuitry involving several single amplifiers is described in DE-OS No. 24 29 953 (published German patent specification).

The common mode rejection in the differential amplifier—or differential amplifier stages—has the disadvantage that at least one additional difference-forming stage is needed in addition to the preamplifier or preamplifiers; the desired signal, without the spurious signal, is obtained only then at the output of such stage. For many measuring applications, particularly in physiological measuring technology such as for EEG and EKG measurements, it is, however, desirable to have the individual useful signals available directly at the output of the preamplifier, in order to make use of various signal processing possibilities without having to proceed via a difference-forming stage or via a differential amplifier stage.

OBJECT, SUMMARY AND ADVANTAGES OF THE INVENTION

The invention has for its object, the solution to the problem of creating an amplifier arrangement for processing a plurality of individually generated desired signals which excels by the feature of substantially reduced circuit investments combined with substantial common mode rejection without there being extreme requirements as far as tolerances of the individual circuit components are concerned. Even when several signal inputs are not connected, satisfactory suppression of spurious signals should be guaranteed.

This problem is solved by the invention as described further below and illustrated herein, in conjunction with advantageous developments of the inventive concept.

A circuit design involving several single amplifiers, preferably in the form of commercially available operational amplifiers of the same type, of which each has connected thereto two additional resistors, is distinguished by the feature that the spurious voltage is already suppressed in these single amplifiers, i.e. in the single prestages and, therefore, is not present in the output, so that the useful signal, or the useful signals, can be taken from the individual prestage outputs and suitable further processed under conditions of relatively low output impedance. This suppression of spurious signals within the prestage is accomplished by applying the low impedance output of an additional single amplifier, preferably also an operational amplifier of the class to which the remaining amplifiers pertain, to a common potential level, i.e. a bus line connected to one of the inputs, preferably the negative inputs, of all remaining single amplifiers. A reference signal is applied to the other input (i.e. the positive input in the selected embodiment) of the additional single amplifier, this reference signal being expected and therefore assumed to be superimposed by the same spurious signal which is superimposed upon the desired signals applied to all other inputs of the single amplifiers. The low-ohmic output of the further single amplifier is thus the combination of the reference desired signal with the superimposed spurious signal, increased by a well defined amplification factor. This signal constitutes the reference signal for all remaining single amplifiers which are connected in circuit with resistors which are preferably mutually of the same value or at least involve the same ratio of resistance values which is the reciprocal of the resistance value ratio associated with the further single amplifier. As a result, a difference is formed within the single stages between the desired signal, combined with the spurious signal, and the reference desired signal, also combined with the same spurious signal, so that the spurious signal is eliminated. A possibly remaining spurious voltage may still appear under circumstances at the outputs of the single amplifiers depending upon the tolerances of the resistors employed. Under any circumstances, the magnitude of the spurious voltage is however substantially smaller, as can be seen from the mathematical derivations supplied further below.

No tolerances are required from the resistors which would be higher than those heretofore applicable under use of a succeeding differential stage for common mode rejection.

The circuitry results in the following major advantages:

When disregarding the one stage which supplies the reference signal, in essence, only half the number of circuit components, particularly of amplifier circuit components, is needed. The resulting savings in investment are particularly stressed because in connection with physiological instruments the prestages are particularly expensive, due to the frequently extreme specifications applied to the input data.

Aside from the savings in costs, the substantial savings in space must also be considered for some applications, which fact is of particular importance when a greater number of prestages must be accommodated within one unit. This is the case with an electrode distributor for EEG instruments with a plurality of electrodes, for example. In this instance, the space-saving aspect fulfills the need for an electrode distributor which is as small and handy as possible.

In view of the fact that the spurious voltage is already almost completely suppressed in the prestage, a useful signal can be directly processed whenever necessary. When a succeeding differential stage is provided, such stage will practically not be needed to contribute to the spurious signal suppression, i.e. the common mode rejection. With similar, possibly still present, error voltages at the output of the input stages, as such voltages may occur also as heretofore at the output from the necessarily present differential stages, the substantial advantage, as compared to known solutions, resides in additional common mode rejection and, therefore, in further improvement with respect to the spurious signal component.

In view of the reduction of impedance, of common mode rejection and of signal amplification, for example in connection with the sensitivity of EEG- and EKG-units, it may become advantageous to further process the improved, amplified and cleaned useful signal under use of electronic switches. Such switching circuitry has heretofore been used in connection with physiological instruments of the mentioned type and specifically such switching circuitry was connected ahead of the differential stages which effected the common mode rejection itself, as is shown in the circuitry of the mentioned DE-OS No. 24 29 953, for example. However, such electronic switches have a forward (pass-through) resistance which may vary up to several hundred ohms within wide limits. If then, as with previous solutions, the common mode voltage (spurious voltage) appears at the output from the input stage, the different high pass-through resistances introduce an error into the common mode voltage and, therefore, cause the quality of common mode rejection to be impaired. The circuitry, in accordance with the invention, eliminates these problems, because complete spurious signal suppression occurs already in the prestage. If therefore a comparable circuitry corresponding to the known circuitry is selected, i.e. circuitry with difference check behind the prestages, then a substantially improved spurious signal suppression is achieved without the pass-through resistance values of the switching circuitry connected therebetween becoming particularly critical.

BRIEF DESCRIPTION OF THE DRAWING

The invention and advantageous detail features are explained in the following with reference to the drawing and in connection with one embodiment.

In the single FIGURE are $V_n$—the single amplifiers of prestages (e.g. $n=1$ to 25), $E_n$, $A_n$—the inputs to and the outputs from the single amplifiers, $U_{En}$—the input voltage to prestage $V_n$ at the input $E_n$, $U_{An}$—the output voltage of prestage $V_n$, $U_f$—the reference voltage at all prestages (at bus line P) in the form of the output voltage of the additional amplifier (in the illustrated example of the single amplifier $V_4$), $U_S$—the spurious voltage applied to all inputs $E_n$, $R_1$, $R_2$—the resistive circuitry of the prestages, $R_2'$, $R_1'$—the resistive circuitry of the prestage ($V_4$ in the illustrated embodiment) supplying the reference voltage $U_f$, W—an electronic interconnection circuit, termed the "connection selector,"

$D_n'$—the differential stages succeeding the input stages via the connection selector (e.g. $n'=1$ to 8, 1 to 12 or 1 to 16), $K_n'$—output voltage of differential stage $D_n'$, and $R_3$, $R_4$—the illustrated resistive circuitry of the differential stages.

DETAILED DESCRIPTION OF THE PREFERRED EMBODIMENT

The circuitry shown in the drawing illustrate the application of the invention to an EEG unit, wherein the outputs $A_1 \ldots A_n$ of prestages $V_1 \ldots V_n$ can be selectively applied to the positive or negative input of a selected one of the amplifiers of $D_1 \ldots D_n'$ which is achieved by means of the selection switching circuit designated the connection selector W. The structure and the operation of the differential amplifiers are known per se and do not require any further explanations herein. If an additional amplification of the useful signal is desired, the ratio of the resistors $R_4/R_3$ can be selected to be greater than 1. In a tested and satisfactory embodiment, ratio $R_4/R_3$ was selected to equal 1, with $R_3=R_4=10k\Omega \pm 1\%$. Operational amplifier units of the type OP 05 C were used as the input stages $V_1 \ldots V_n$, as well as the differential stages $D_1 \ldots D_n'$. In connection with an EEG-unit, there are 25 measuring electrodes, by way of example, which consequently generate 25 electrode signals which are amplified by the 25 input stages in the electrode distributor of the EEG-unit to a satisfactory desired signal level, associated with suppression of the spurious signal level in accordance with the invention.

The reference voltage $U_f$ for all input stages applied to the common reference bus line P is derived via an input $E_4$ (fourth electrode); this reference voltage is composed of the reference desired signal $U_{E4}$ and the spurious signal applied to all inputs. Instead of the fourth electrode, used in the illustrated embodiment, any other electrode can be employed. Similarly, the illustrated preamplifier $V_4$ can be substituted by another distinct amplifier, particularly an operational amplifier with two inputs. There is no additional electrode required which would be in addition to those which are provided within the program of a commercially available EEG- or EKG-unit, for example.

In the illustrated circuit, the resistors $R_1$ which interconnect respective ones of the outputs $A_1$, $A_2$, $A_3$, $A_5$ ... $A_n$ with the associated minus input are all identical. Correspondingly, the resistors $R_2$ which interconnect respective minus inputs with the common circuit bus line P are selected to have the same resistance value. This selection of identical resistance values in the preamplifiers is believed recommendable for pratical purposes in most applications, particularly in order to retain the resistance tolerances within comparable narrow limits: However, this selection is not a necessary requirement for the proper functioning of the circuit. Essential only is the fact that the ratio of the resistance values $R_1/R_2$ is the same for all prestages which are not employed in the generation of the reference voltage. The prestage used for generating the reference voltage (prestage V4 in the illustrated embodiment) includes resistors designated $R_2'$ and $R_1'$. For practical purposes, it is suitable to select the resistance values in most instances such that $R_2'=R_2$ and $R_1'=R_1$. It is true that it is important only that the ratio $R_2'/R_1'$ corresponds to the ratio $R_2/R_1$, i.e. that it corresponds to the reciprocal value of the ratio $R_1/R_2$. In a tested satisfactory embodiment of the circuit, the selection was such that $R_1=R_1'=500\ \text{k}\Omega \pm 1\%\text{o}$ and $R_2=R_2'=10\ \text{k}\Omega\pm 1\%\text{o}$.

In the following, the operation of the circuit will be considered with respect to the desired signals exclusively.

The output voltages $U_{A1} \ldots U_{An}$ are represented with reference to the circuit illustration as follows:

$$U_{An} = U_{En} \cdot (1 + \frac{R_1}{R_2}) - U_f \cdot \frac{R_1}{R_2} \quad (1)$$

$$U_f = U_{E4} \cdot (1 + \frac{R_2'}{R_1'}) \quad (2)$$

With equation (2) substituted into equation (1), one obtains:

$$U_{An} = U_{En}(1 + \frac{R_1}{R_2}) - U_{E4}(1 + \frac{R_2'}{R_1'}) \cdot$$

$$\cdot \frac{R_1}{R_2}, \text{ with } \frac{R_2'}{R_1'} = \frac{R_2}{R_1}$$

one obtains:

$$U_{An} = U_{En}(1 + \frac{R_1}{R_2}) - U_{E4}(1 + \frac{R_1}{R_2}) \quad (3)$$

$$U_{An} = (U_{En} - U_{E4}) \cdot (1 + \frac{R_1}{R_2})$$

$$U_{An} = (U_{En} - U_{E4}) \cdot V \text{ with } V = 1 + \frac{R_1}{R_2}$$

The reference voltage $U_f$ at the common bus line P is thus eliminated inasmuch as it appeared in equation (1) but, due to the substitution of equation (2) into equation (1), no longer appears in equation (3) and the output voltages $U_{A1}, U_{A2} \ldots U_{An}$ result as a differential value between the respective input and reference voltages, amplified by the selectable amplification factor V, so that the spurious signal is suppressed by common mode rejection at the time of forming the difference in the respective prestage. The amplified, relatively low-ohmic output signals of the prestages can, in principle, be further processed in any desires manner already from this point. In the illustrated circuit design, these output voltages are applied by pairs to one of the differential amplifiers by means of the connection selector W as explained. Then, for example, the following voltages appear at the outputs $K_1 \ldots K_n'$:

$$K_1 = U_{A1} - U_{A2} = (U_{E1} - U_{E4}) \cdot V - (U_{E2} - U_{E4}) \cdot V =$$
$$(U_{E1} - U_{E2}) \cdot V \quad (4)$$

$$K_2 = U_{A2} - U_{An} = (U_{E2} - U_{E4}) \cdot V - (U_{En} - U_{E4}) \cdot V =$$
$$(U_{E2} - U_{En}) \cdot V \quad (5)$$

and so forth.

If this derivation is selected by the formation of differences, no error is introduced into the signal voltage because the first formation of a difference with $U_{E4}$ in the prestage is cancelled by the second difference formation.

The formation of the difference (derivation) between $U_{E4}$ and any one of the other inputs can easily be implemented:

At the output of the input stages appear a differential voltage between each input and $U_{E4}$ applied to the reference input, multiplied by the amplification factor V. The desired derivation between $U_{En}$ and $U_{E4}$ is applied to one input of the selected differential amplifier $D_n'$ and the other input is maintained at zero volts. If the output of the respective input stage is applied to the non-inverting input of the selected differential amplifier, then one obtains the derivation $(U_{En}-U_{E4})$. If, conversely, the output from the input stage is applied to the inverting input of the differential amplifier, one obtains the derivation $(U_{E4}-U_{En})$.

In the following, the operation of the circuit will be considered exclusive with respect to the spurious voltages. In order to make the distinction between the above discussion of desired signals, the derived voltages are designated by the additional subscript S. The following assumptions constitute a basis for these considerations.

1. The spurious voltage $U_S$ is applied to all amplifier inputs $E_n$ with the same amplitude and in phase.

2. The resistors $R_1$ and $R_2$ have all the same tolerance range.

3. Regarding resistors $R_1'$ and $R_2'$, the following condition prevails: $R_1'=R_1$ and $R_2'=R_2$.

With the resistance tolerance $F=T/100$ (T=resistance tolerance in percent) and taking into account possible tolerance deviations, the following relationships involving the resistors prevail:

$$R_{1F}=R_1(1+F_1); R_{2F}=R_2(1+F_2) \quad (6)$$

The tolerance factor F can be positive or negative.

It is presumed, and it is true in practice, that the spurious voltages at the inputs are equal one to another, i.e.:

$$U_{E1S}=U_{E2S}=U_{E(n-1)S}=U_{ES}$$

Neglecting now the tolerances, one obtains the following equations, with the spurious voltage $U_S$ applied to the inputs $E_1$ through $E_n$ being in accordance with equation (1) above:

$$U_{AS} = U_s(1 + \frac{R_1}{R_2}) - U_{fS} \cdot \frac{R_1}{R_2} \quad (7)$$

With $U_{fS} = U_s(1 + \frac{R_2}{R_1})$, one obtains:

$$U_{AS} = U_s\left[1 + \frac{R_1}{R_2} - \frac{R_1}{R_2} - 1\right] = 0$$

Taking into account the tolerances, one obtains the following equation for the output voltage:

$$U_{AS} = U_s (1 + \frac{R_1}{R_2} \cdot a) - U_s (1 + \frac{R_2}{R_1} \cdot b) \frac{R_1}{R_2} \cdot a \qquad (8)$$

With $a = \frac{1+F_2}{1+F_1}$ and $b = \frac{1+F_1}{1+F_2}$ one obtains $$U_{AS} = U_s (1 - a \cdot b) \qquad (9)$$

The factor b which refers to the reference signal amplifier is constant for all amplifiers, so that it is not necessary to consider all possible error combinations in detail. The smallest value of a·b results in a maximum value of remaining spurious voltage $U_{AS}$ at the output.

In order to determine the maximum remaining spurious voltage, the amounts of resistance tolerances are substituted into the factors a and b. Taking into account equation (8), one obtains:

$$U_{AS} = U_s \left[ 1 - \frac{(1 - |F_2|)(1 - |F_1|)}{(1 + |F_1|)(1 + |F_2|)} \right] \qquad (10)$$

The maximum difference between two output voltages is obtained when the factor a·b for a specific amplifier satisfies the condition:

$$a \cdot b = \frac{(1 + |F_2|) \cdot (1 + |F_1|)}{(1 - |F_1|) \cdot (1 - |F_2|)}$$

and when $a \cdot b = 1$ is true for the second amplifier.

The common mode rejection CMRR at any one of the input stages is calculated as follows:

$$CMRR = \left( \frac{U_s}{U_{xS} - U_{yS}} \right) \cdot V \qquad (11)$$

where $U_{xS}$ and $U_{yS}$ designate any two of the spurious output voltages $U_{A1S}$ through $U_{A(n-1)S}$. With $F_1, F_2 \to 0$ one obtains from equation (11) that CMRR $\to \infty$.

The described embodiment of the invention relates to the input section of any EEG-unit with 25 physiological measuring electrodes. Application of the invention is, however, not limited to EEG- and EKG-units. Rather, the invention can be employed in connection with measuring instruments (preferably with several simultaneously applied quantities to be measured), whenever it is important that a weak useful signal is amplified to a level which is satisfactory for further processing and whenever a strong spurious signal is simultaneously present. Measuring problems of this type are not only encountered in connection with physiological measuring techniques, but also in connection with other fields of technology, for example seismic data processing technology, chemical measuring technology, in the field of non-destructive material testing technology, in connection with underwater sonar technology, and so forth. Various modifications of the amplifier arrangement in accordance with the invention are possible within the frame of the inventive concept, particularly in connection with the design of the single amplifier employed for generating the reference signal.

I claim:

1. An improved amplifier arrangement for a plurality of individually generated desired signals to be processed, upon which useful signals a relatively stronger noise signal is superimposed, comprising a plurality of like single amplifiers, each having a positive and a negative input terminal, wherein each positive input terminal receives a specific useful signal having the spurious signal superimposed thereon, and wherein each negative input terminal is connected to the output terminal of the respective amplifier via an associated first resistor and to a bus line common to all single amplifiers at a common potential via an associated second resistor, the ratio of resistance values between interconnected first and second resistors being the same for all single amplifiers, wherein the improvement comprises: an additional amplifier having a positive and a negative input terminal, which additional amplifier has its output terminal connected to the bus line, the output terminal of the additional amplifier being connected to the negative input terminal via a third resistor, the negative input terminal in turn being connected to a reference potential through a fourth resistor, while one of the useful signals is applied to the positive input terminal of the additional amplifier, the ratio between the resistance values of the third and fourth resistors being equal to the reciprocal of the ratio of the resistance values between the interconnected first and second resistors.

2. Amplifier arrangement according to claim 1, wherein the first resistors are selected to have all the same resistance value and the second resistors are also selected to have the same resistance value.

3. Amplifier arrangement according to claim 2, wherein the resistance value of the third resistor is equal to that of one of the second resistors and that the resistance value of the fourth resistor is equal to that of one of the first resistors.

4. Amplifier arrangement in accordance with claim 2 or claim 3, wherein each of the single amplifiers is an operational amplifier with the same characteristic values.

5. Amplifier arrangement according to claim 4, wherein the additional amplifier is an amplifier having a high amplification factor, preferably an operational amplifier.

6. Amplifier arrangement in accordance with claim 5, wherein the outputs of the single amplifiers can be switched selectively and by pairs over a selector circuit to the negative and positive input respectively of one of a plurality of differential amplifiers.

* * * * *